(12) United States Patent
Choi et al.

(10) Patent No.: US 11,367,666 B2
(45) Date of Patent: Jun. 21, 2022

(54) CLIP, LEAD FRAME, AND SUBSTRATE USED IN SEMICONDUCTOR PACKAGE HAVING ENGRAVED PATTERN FORMED THEREON AND THE SEMICONDUCTOR PACKAGE COMPRISING THE SAME

(71) Applicant: JMJ Korea Co., Ltd., Bucheon-si (KR)

(72) Inventors: Yun Hwa Choi, Bucheon-si (KR); Jeong Hun Cho, Goyang-si (KR); Soon Seong Choi, Gunpo-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 344 days.

(21) Appl. No.: 16/638,135

(22) PCT Filed: Aug. 23, 2018

(86) PCT No.: PCT/KR2018/009736
§ 371 (c)(1),
(2) Date: Feb. 11, 2020

(87) PCT Pub. No.: WO2019/066264
PCT Pub. Date: Apr. 4, 2019

(65) Prior Publication Data
US 2020/0176342 A1    Jun. 4, 2020

(30) Foreign Application Priority Data

Sep. 29, 2017  (KR) .................. 10-2017-0127134
Nov. 14, 2017  (KR) .................. 10-2017-0151492

(51) Int. Cl.
*H01L 23/13*      (2006.01)
*H01L 23/31*      (2006.01)
*H01L 23/495*     (2006.01)

(52) U.S. Cl.
CPC .......... *H01L 23/13* (2013.01); *H01L 23/3121* (2013.01); *H01L 23/49517* (2013.01); *H01L 23/49541* (2013.01)

(58) Field of Classification Search
CPC ................. H01L 23/13; H01L 23/3121; H01L 23/49541; H01L 23/49548;
(Continued)

(56) References Cited

U.S. PATENT DOCUMENTS

| | | | |
|---|---|---|---|
| 4,861,407 A | 8/1989 | Volkmann et al. | |
| 2014/0001620 A1* | 1/2014 | Shimizu | H01L 24/73 257/676 |

(Continued)

FOREIGN PATENT DOCUMENTS

| | | |
|---|---|---|
| JP | H06-338583 A | 12/1994 |
| JP | H10-303355 A | 11/1998 |

(Continued)

OTHER PUBLICATIONS

International Search Report in International Application No. PCT/KR2018/009736, dated Dec. 13, 2018, 2 pages.

*Primary Examiner* — Tucker J Wright
(74) *Attorney, Agent, or Firm* — Park, Kim & Suh, LLC

(57) ABSTRACT

Provided is a semiconductor package. More particularly, the present invention relates to a clip, a lead frame, and a substrate used in a semiconductor package having engraved patterns formed on surfaces thereof so as to increase an adhesive force and a corrosion resistant performance, thereby improving reliability of the semiconductor package, and the semiconductor package including the same.

35 Claims, 15 Drawing Sheets

(58) Field of Classification Search
CPC ......... H01L 23/49517; H01L 23/49524; H01L 2924/18301; H01L 23/3142; H01L 2224/83385

See application file for complete search history.

(56) References Cited

U.S. PATENT DOCUMENTS

2016/0315054 A1* 10/2016 Kajihara ............... H01L 23/562
2018/0197802 A1* 7/2018 Nagamatsu ............. H01L 23/50

FOREIGN PATENT DOCUMENTS

| | | |
|---|---|---|
| JP | 2012-064880 A | 3/2012 |
| JP | 2014-60410 A | 4/2014 |
| JP | 2016-42538 A | 3/2016 |
| JP | 2017-76764 A | 4/2017 |
| JP | 6150938 B2 | 6/2017 |
| KR | 10-1208332 B1 | 12/2012 |
| KR | 10-1249745 B1 | 4/2013 |
| KR | 10-2015-0129269 A | 11/2015 |
| KR | 10-1591643 B1 | 2/2016 |
| KR | 10-1643332 B1 | 7/2016 |
| KR | 10-2017-0012927 A | 2/2017 |
| KR | 10-1754031 B1 | 7/2017 |

\* cited by examiner (a)

(b)

(a)

(b)

(c)

(d)

(e)

(f)

(g)

(h)

(i)

(a)

(b)

(a)

(b)

(b)

(a)

(b)

(a)

(a) (b) (c) (d) (e)

(a)          (b)          (c)

CLIP, LEAD FRAME, AND SUBSTRATE USED IN SEMICONDUCTOR PACKAGE HAVING ENGRAVED PATTERN FORMED THEREON AND THE SEMICONDUCTOR PACKAGE COMPRISING THE SAME

CROSS-REFERENCE TO RELATED APPLICATIONS

This application is the National Stage filing under 35 U.S.C. 371 of International Application No. PCT/KR2018/009736, filed on Aug. 23, 2018, which claims the benefit of Korean Patent Application No. 10-2017-0127134, filed on Sep. 29, 2017 and Korean Patent Application No. 10-2017-0151492, filed on Nov. 14, 2017, the contents of which are all hereby incorporated by reference herein in their entirety.

FIELD OF THE INVENTION

The present invention relates to components of a semiconductor package and the semiconductor package including the components, and more particularly, to components of a semiconductor package including a metal clip, a lead frame, and a substrate having engraved patterns formed on surfaces thereof so as to increase an adhesive force and a corrosion resistant performance, thereby improving reliability of the semiconductor package, and the semiconductor package including the components.

DESCRIPTION OF THE RELATED ART

In general, a semiconductor package is manufactured in such a way that a semiconductor chip is mounted on a pad of a lead frame or a substrate, the semiconductor chip is connected to a lead of the lead frame by a clip or a bonding wire, and the periphery thereof is molded by a sealing material formed of a thermosetting material such as an epoxy molding compound (EMC).

In such a general semiconductor package, a clip and a semiconductor chip, a clip and a lead of a lead frame, and a lead frame pad or a substrate and a semiconductor chip are adhered to each other by using an adhesive such as solder. Also, the periphery of a clip, a semiconductor chip, and a lead frame is sealed by using a sealing material such as an EMC. Since components of a semiconductor package are formed of metals, an adhesive force between the components and the sealing material is relatively low and thereby, separation frequently occurs between a metal surface and the sealing material. Accordingly, internal corrosion may cause due to penetration of micro-moisture from the outside, and electrical quality and reliability of a semiconductor package may be lowered due to a defect in an adhesive property of a clip and a lead of a lead frame, and a lead frame pad or a substrate and a semiconductor chip.

SUMMARY OF THE INVENTION

Technical Problem

The present invention provides a semiconductor package for improving adhesive forces between components of the semiconductor package including a sealing material such as an epoxy molding compound (EMC), a clip, a lead frame, and a substrate, between a semiconductor chip and the lead frame, and between the lead frame and the clip and for minimizing penetration of micro-moisture from the outside of the semiconductor package so that internal corrosion of the semiconductor package may be prevented and thereby, electrical quality and reliability of the semiconductor package may be improved.

Technical Solution

According to an aspect of the present invention, there is provided components used in a semiconductor package including a clip, a lead frame, and a substrate having finely engraved patterns formed on metal surface thereof.

Here, the engraved pattern may have a cross-section in a V form or a U form. The engraved pattern may include any one selected from a diamond-shaped lattice pattern, a vertical line pattern, a triangle pattern, a diagonal line pattern, a square lattice pattern, a quadrangle pattern, a horizontal line pattern, a circle pattern, and a honeycomb pattern.

The engraved pattern may have a depth of 2 μm to 100 μm and a width of 5 μm to 80 μm.

The engraved pattern may include first metal projections projected relatively higher than the metal surface at outer edges of hollow parts therein and the first metal projections may have a height of 0.5 μm to 50 μm.

The engraved pattern may include second metal projections formed in an inner wall thereof.

According to another aspect of the present invention, there is provided a semiconductor package including a clip, a lead frame, and a substrate having the engraved patterns formed on at least one or more metal surfaces thereof.

Advantageous Effects

According to the present invention, an engraved pattern is formed on a metal surface of components used in a semiconductor package. Accordingly, adhesive forces between a sealing material and a clip, a lead frame, and a substrate, between a semiconductor chip and the lead frame, and between the lead frame and the clip are improved and micro-moisture may be prevented from penetrating from the outside of a semiconductor package. Therefore, internal corrosion of a semiconductor package may be prevented and thereby, electrical quality and reliability of a semiconductor package may be improved.

DESCRIPTION OF SYMBOLS

Figure 1:
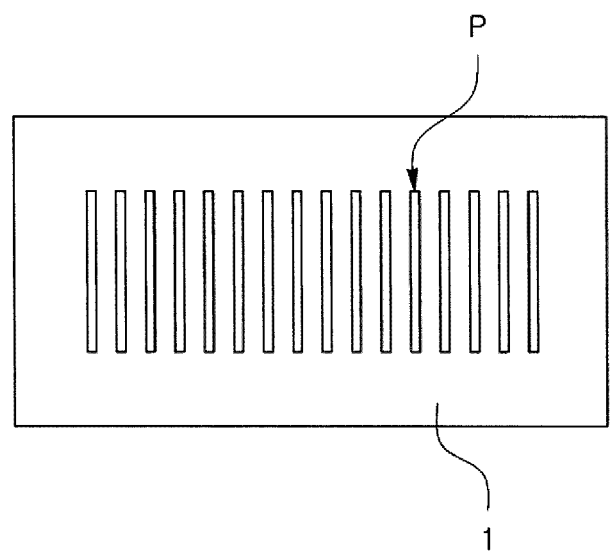
FIG. 1 respectively illustrates a plan cross-sectional view (a) and a side cross-sectional view (b) of a typical engraved pattern formed on a surface of a metal plate including a clip, a lead frame, and a substrate used in a semiconductor package according to an embodiment of the present invention.
Figure 1:
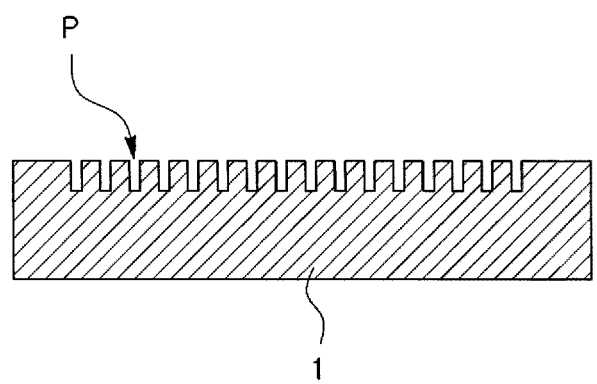

1: Metal plate P: Engraved pattern
1a: First metal projections 1b: Second metal projections
110: Lead frame 111: Lead frame pad
112,113: Lead frame leads 120: Semiconductor chip
130: Wire 140: Adhesive
150: Sealing material 160: Clip
200: Substrate

DETAILED DESCRIPTION OF THE INVENTION

Hereinafter, a clip, a lead frame, a substrate used in a semiconductor package, and structure and operation of the semiconductor package including the clip, the lead frame, and the substrate will be described in more detail with reference to the accompanying drawings.

Figure 2:
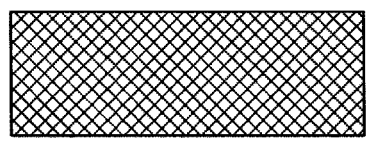
FIG. 2 illustrates various forms of engraved patterns respectively formed on a surface of a metal plate including a clip, a lead frame, and a substrate used in a semiconductor package according to an embodiment of the present invention.
Figure 2:
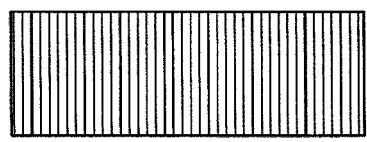
Figure 2:
Figure 2:
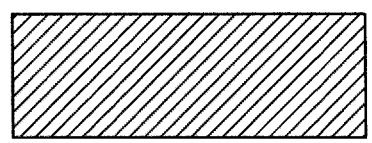
Figure 2:
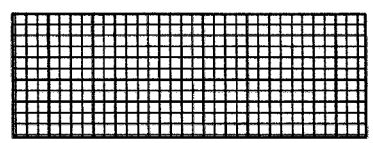
Figure 2:
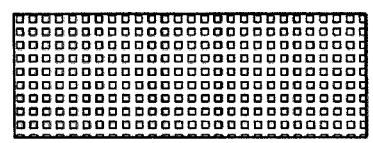
Figure 2:
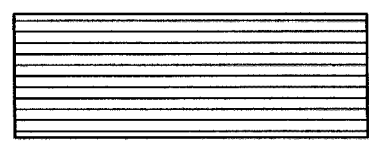
Figure 2:
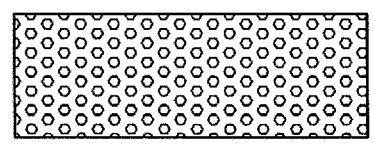
Figure 2:
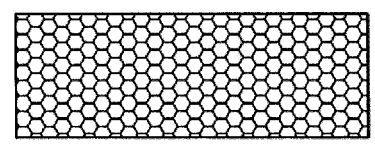

FIG. 1 respectively illustrates a plan cross-sectional view (a) and a side cross-sectional view (b) of a typical engraved pattern P formed on a metal plate 1 including a metal clip, a lead frame, and a substrate used in a semiconductor package according to an embodiment of the present invention;

The engraved pattern P formed on a surface of the metal plate 1 including the clip, the lead frame, and the substrate is formed by irradiating a laser and includes a plurality of continuous line-form grooves. As illustrated in FIG. 1, the engraved pattern P may be formed parallel to each other on the center of the metal plate 1 and may be a plurality of line-form hollow patterns having a predetermined depth. As illustrated in FIG. 2, fine and hollow grooves having various forms of pattern may be repeatedly formed on the metal surface such as in a diamond-shaped lattice pattern in (a), a vertical line pattern in (b), a triangle pattern in (c), a diagonal line pattern in (d), a square lattice pattern in (e), a quadrangle pattern in (f), a horizontal line pattern in (g), a circle pattern in (h), and a honeycomb pattern in (i). Also, the substrate used in a semiconductor package may be a metal substrate entirely formed of a metal or an insulating substrate such as a direct bonded copper (DBC) substrate formed by stacking a circuit pattern formed using a conductive material such as copper on upper and lower surfaces of a soft ceramic layer. The engraved pattern P may be formed on the metal substrate or a metal surface of the insulating substrate.

Figure 3:
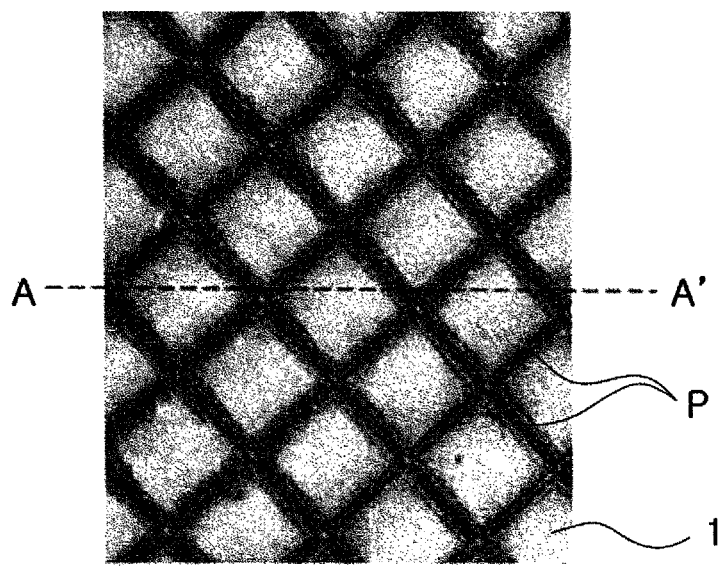
FIG. 3 illustrates an example (a) of a diamond-shaped lattice engraved pattern formed on a surface of a metal plate including a clip, a lead frame, and a substrate used in a semiconductor package according to an embodiment of the present invention, and a picture (b) of a cross-section of the metal plate cutting along a line A-A'.
Figure 3:
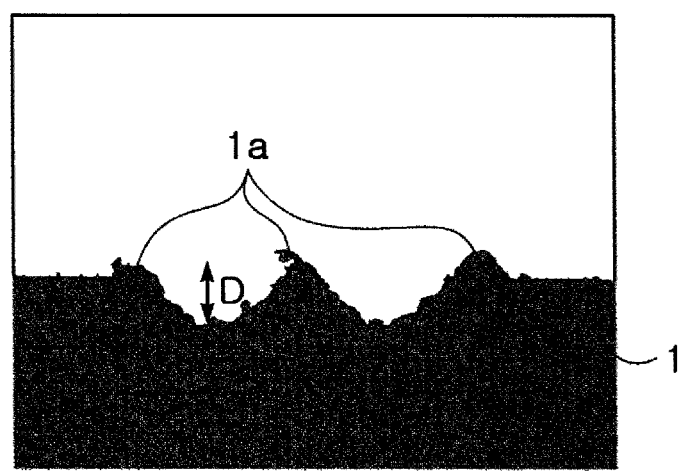

FIG. 3 illustrates an example (a) of the diamond-shaped lattice engraved pattern P formed on a surface of the metal plate 1 and a picture (b) of a cross-section of the metal plate 1 cutting along a line A-A'. As illustrated in (b) of FIG. 3, the engraved pattern P has a regular depth D and hollow parts thereof are mostly in a V form.

Here, the engraved pattern P is formed by irradiating a laser on the surface of the metal plate 1 including a clip, a lead frame, and a substrate and the depth D may be in the range of 2 μm to 100 μm. When the depth D of the engraved pattern P is 2 μm or below, an adhesive force between a molding material and an adhesive is insufficient. Also when the depth D of the engraved pattern P is 100 μm or above, the clip, the lead frame, and the surface of the substrate may be damaged. Accordingly, it is technically difficult to manufacture the metal plate 1 and its reliability may be adversely affected. The depth D of the engraved pattern P may be adjusted according to an output of an irradiated laser, irradiating time, and a number of being irradiated. Also, a width of the engraved pattern P may be in the range of 5 μm to 80 μm. A laser output used in the present invention may be in the range of 5 W to 50 W, a thickness of a laser beam may be in the range of 0.05 mm to 1 mm, and a frequency of a laser may be in the range of 1 Khz to 1000 Khz.

In addition, as illustrated in (b) of FIG. 3, outer edges of the hollow parts in the engraved pattern P may include first metal projections 1a projected relatively higher than the surface of the metal plate 1. As the first metal projections 1a are projected higher than the surface of the metal plate 1, surface roughness of the metal plate 1 significantly increases and contact areas between the first metal projections 1a and sealing materials are widened. Accordingly, the sealing materials stick to the first metal projections 1a and thereby, an adhesive force is increased. Also, micro-moisture penetrating from the outside along the surface of the metal plate 1 is blocked by the first metal projections 1a and thus, internal corrosion occurring due to penetration of micro-moisture may be efficiently prevented. A height of the first metal projections 1a may be in the range of 0.5 μm to 50 μm.

Figure 4:
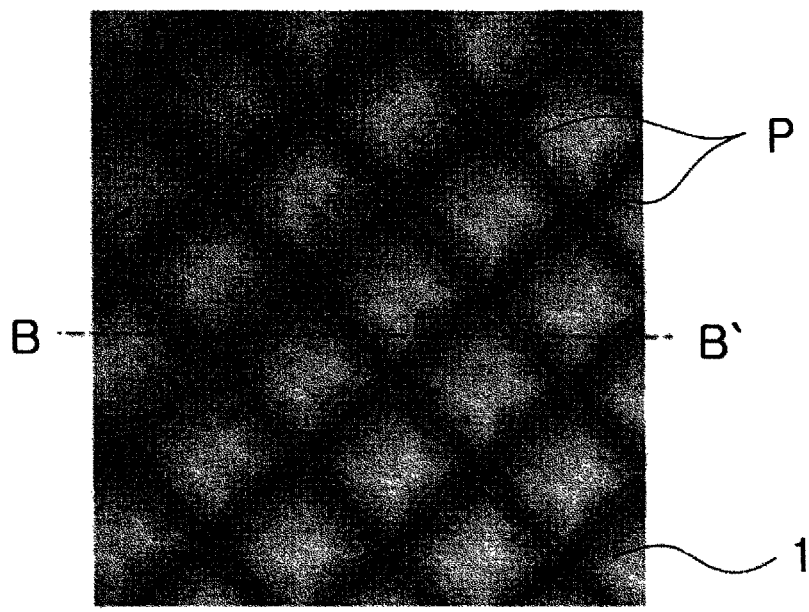
FIG. 4 illustrates another example (a) of a diamond-shaped lattice engraved pattern formed on a surface of a metal plate including a clip, a lead frame, and a substrate used in a semiconductor package according to an embodiment of the present invention, and an electron micrograph (b) of a cross-section of the metal plate cutting along a line B-B'.
Figure 4:
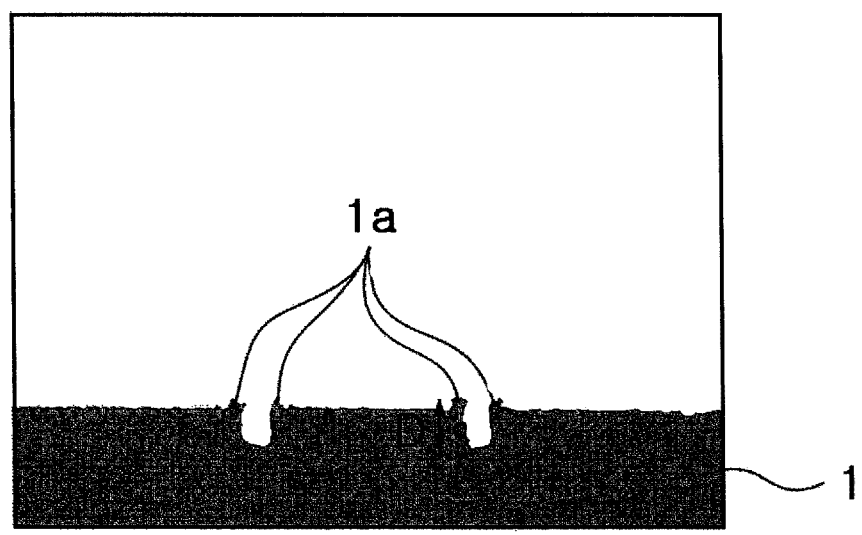

FIG. 4 illustrates another example (a) of the diamond-shaped lattice engraved pattern P formed on a surface of the metal plate 1 and an electron micrograph (b) of a cross-section of the metal plate 1 cutting along a line B-B'. As illustrated in (b) of FIG. 4, the engraved pattern P also has a regular depth D and hollow parts thereof are mostly in a U form. In the same manner, the engraved pattern P may be formed by irradiating a laser on the surface of the metal plate 1 including a clip, a lead frame, and a substrate and the depth D may be in the range of 2 μm to 100 μm. In addition, as illustrated in (b) of FIG. 4, outer edges of the hollow parts in the engraved pattern P may also include the first metal projections 1a projected relatively higher than the surface of the metal plate 1.

Figure 5:
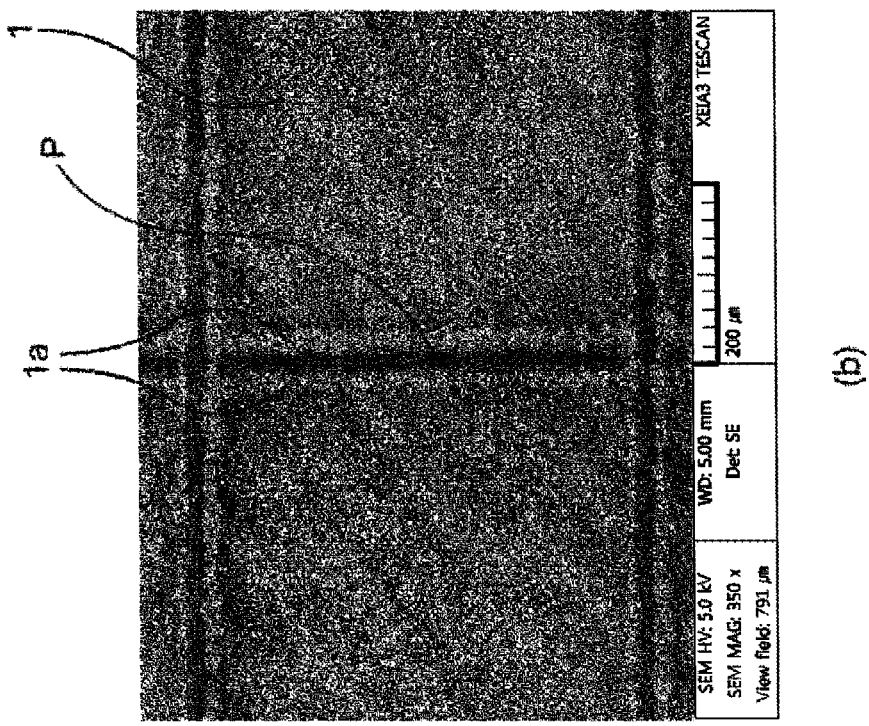
FIG. 5 illustrates another example (a) of a diamond-shaped lattice engraved pattern formed on a surface of a metal plate including a clip, a lead frame, and a substrate used in a semiconductor package according to an embodiment of the present invention, and an electron micrograph (b) of the engraved pattern (a) which is partially enlarged.
Figure 5:
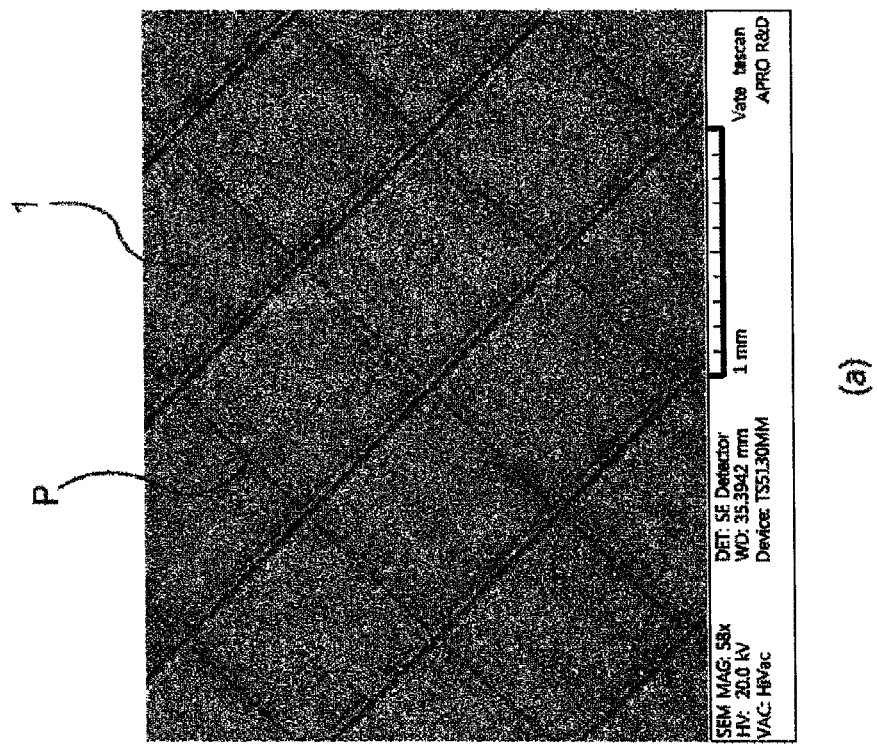

FIG. 5 illustrates another example (a) of the diamond-shaped lattice engraved pattern P formed on a surface of the metal plate 1 and an electron micrograph (b) of the engraved pattern P which is partially enlarged. As illustrated in FIG. 5, the first metal projections 1a are formed to be projected along the outer edges of the upper part of the hollow parts in the engraved pattern P formed on the metal plate 1.

Figure 6:
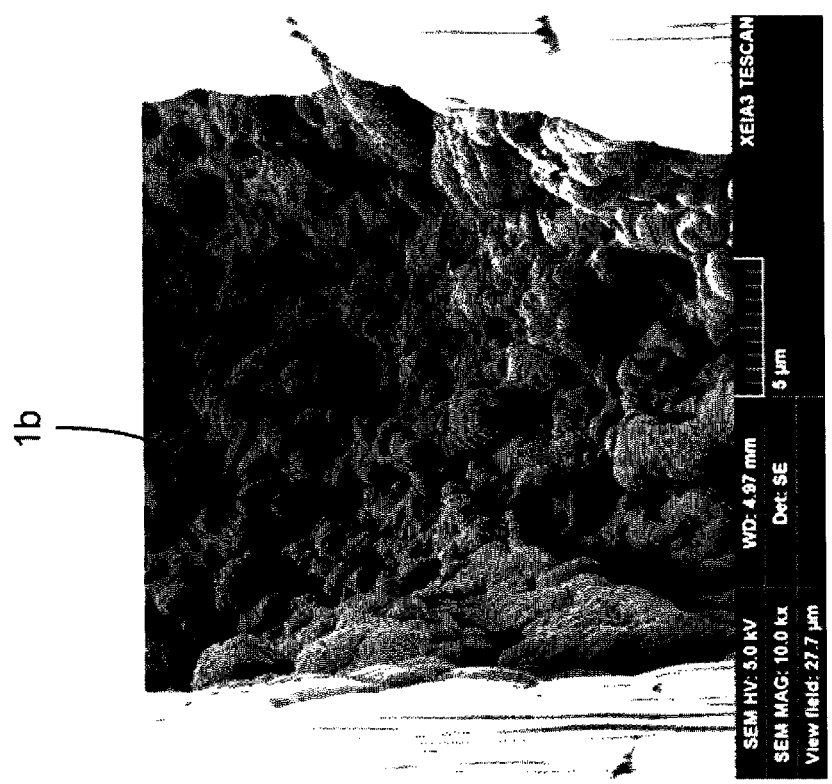
FIG. 6 illustrates electron micrographs of a cross-section (a) and an inner wall (b) of an engraved pattern formed on a surface of a metal plate including a clip, a lead frame, and a substrate used in a semiconductor package according to an embodiment of the present invention.
Figure 6:
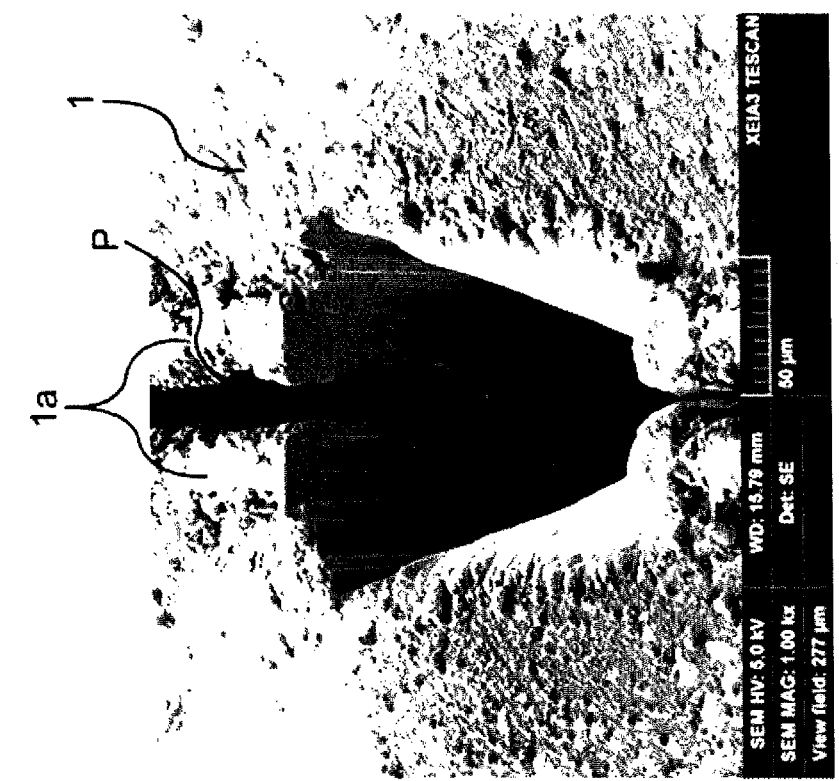

FIG. 6 illustrates electron micrographs of a cross-section (a) and an inner wall (b) of the engraved pattern P formed on the surface of the metal plate 1. In (a) of FIG. 6, the metal plate 1, on which the engraved pattern P is formed as in FIG. 5, is vertically cut by a predetermined depth and a cross-section thereof is captured. Here, the projected first metal projections 1a are formed along the outer edge of the hollow parts in the engraved pattern P and the inner wall thereof is uneven. The surface of the inner wall of the engraved pattern P is shown in (b) of FIG. 6 and second metal projections 1b are unevenly formed all over the inner wall. Since a plurality of the second metal projections 1b are formed in the inner wall of the engraved pattern P, the surface of the inner wall is uneven and thus, an adhesive force between sealing materials and the inner wall of the engraved pattern P is increased.

When the finely engraved pattern P is formed by irradiating a laser on a metal surface, the outer edge of the hollow parts in the engraved pattern P and the surface of the inner wall of the engraved pattern P are melted by a laser and hardened after being cooled down. Here, such first metal projections 1a and second metal projections 1b are formed unevenly in a round bubble form and thereby, an adhesive force between sealing materials and first metal projections 1a, and sealing materials and second metal projections 1b may be increased due to such an uneven surface structure.

Figure 7:
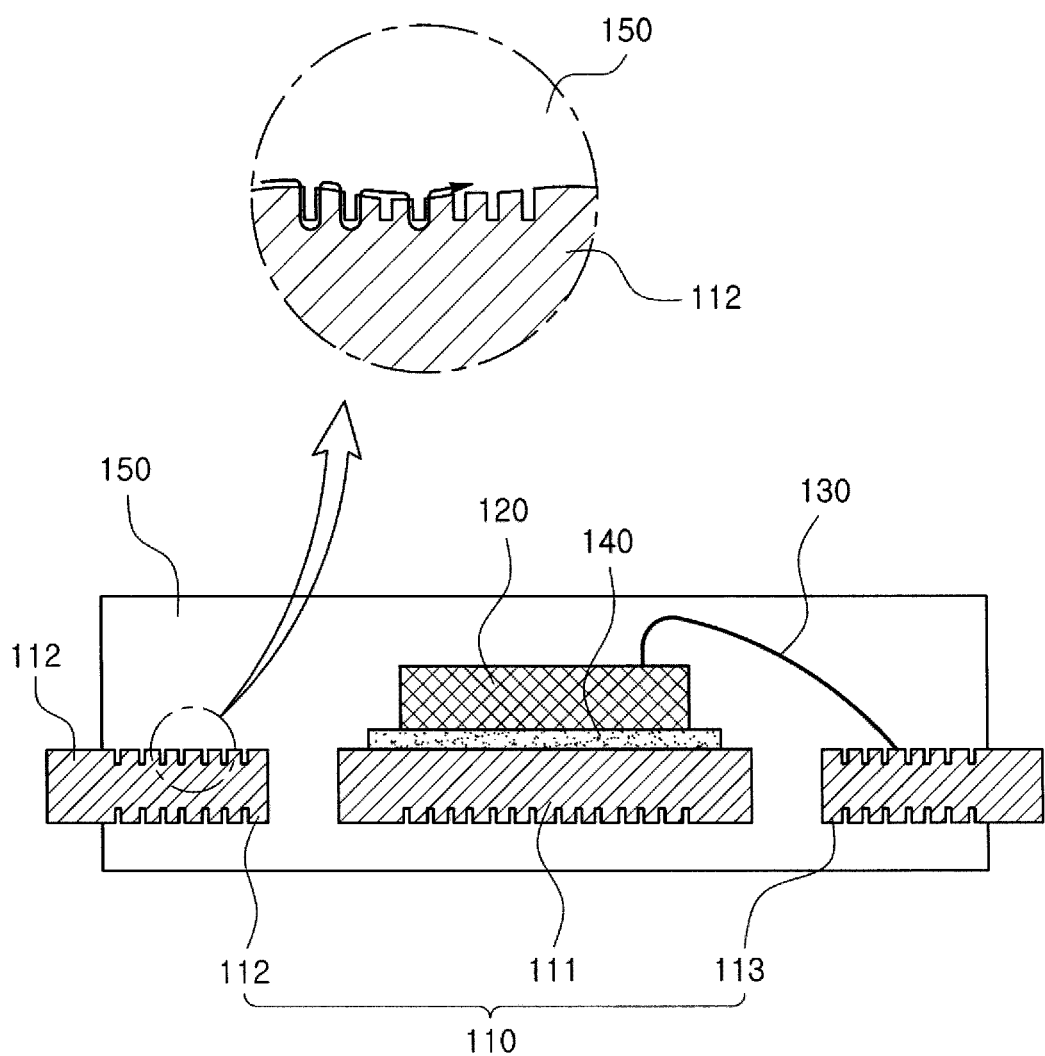
FIG. 7 is a cross-sectional view of a semiconductor package in which an engraved pattern is formed on a lead frame according to an embodiment of the present invention.

FIG. 7 is a cross-sectional view of a semiconductor package including a lead frame 110 on which an engraved pattern is formed according to an embodiment of the present invention. As illustrated in the drawing, a lead frame pad 111 is disposed at the center and lead frame leads 112 and 113 are disposed to be spaced apart from each other by a predetermined gap around the lead frame pad 111. The lead frame leads 112 and 113 and the pad 111 are formed using copper, a copper alloy, or other adequate conductive metal materials. A semiconductor chip 120 is adhered to the upper surface of the lead frame pad 111 by using a conductive adhesive 140 such as solder and may be electrically connected to the lead frame leads 112 and 113 by using a wire 130. Also, the periphery of the lead frame pad 111, the lead frame leads 112 and 113, the semiconductor chip 120, and the wire 130 are molded using a sealing material 150 such as an epoxy molding compound (EMC) and thus, a package body is formed. Here, ends of the lead frame leads 112 and 113 are exposed to the outside of the sealing material 150 so as to be connected to a circuit part of an electronic device in which a semiconductor package is to be mounted.

As illustrated in the drawing, the engraved pattern may be formed on the lower surface of the lead frame pad 111 and the upper surfaces and/or lower surfaces of the lead frame leads 112 and 113. Accordingly, the sealing material 150 penetrates and fills the inside of a hollow part in the engraved pattern so that an adhesive force is improved compared to that of in a smooth surface-to-surface contact and separation of a metal surface may be prevented. Thus, electrical quality and reliability of a semiconductor package may be improved. Also, forms of the engraved pattern may vary or sizes such as a depth and a length may vary so that the spread of the adhesive 140 such as solder may be controlled. Accordingly, deterioration in electrical quality occurring due to the rough spread of the adhesive 140 in various directions may be prevented.

In a general semiconductor package, micro-moisture may easily penetrate the inside of the package along the surfaces of the lead frame leads 112 and 113, wherein the ends of the lead frame leads 112 and 113 are exposed to the outside of the sealing material 150, and thereby, corrosion of inner components in the semiconductor package may be frequently generated. Consequently, electrical properties may be lowered due to such internal corrosion and thereby, its reliability is decreased. However, as illustrated in a circle of FIG. 7, when the engraved pattern is formed on the lead frame leads 112 and 113 or the lead frame pad 111, a direction of a path for micro-moisture penetration as indicated with an arrow is changed in a zig-zag form due to consecutive depths of the engraved pattern, a length of the path is relatively lengthened, and hollows parts function as barriers. Accordingly, it is difficult for micro-moisture to penetrate the inside of the semiconductor package deeply and thus, possibilities for generating internal corrosion may be significantly lowered. Furthermore, as described above, when the first metal projections are formed on the outer edges of the hollow parts in the engraved pattern, penetration of micro-moisture may be efficiently controlled.

Figure 8:
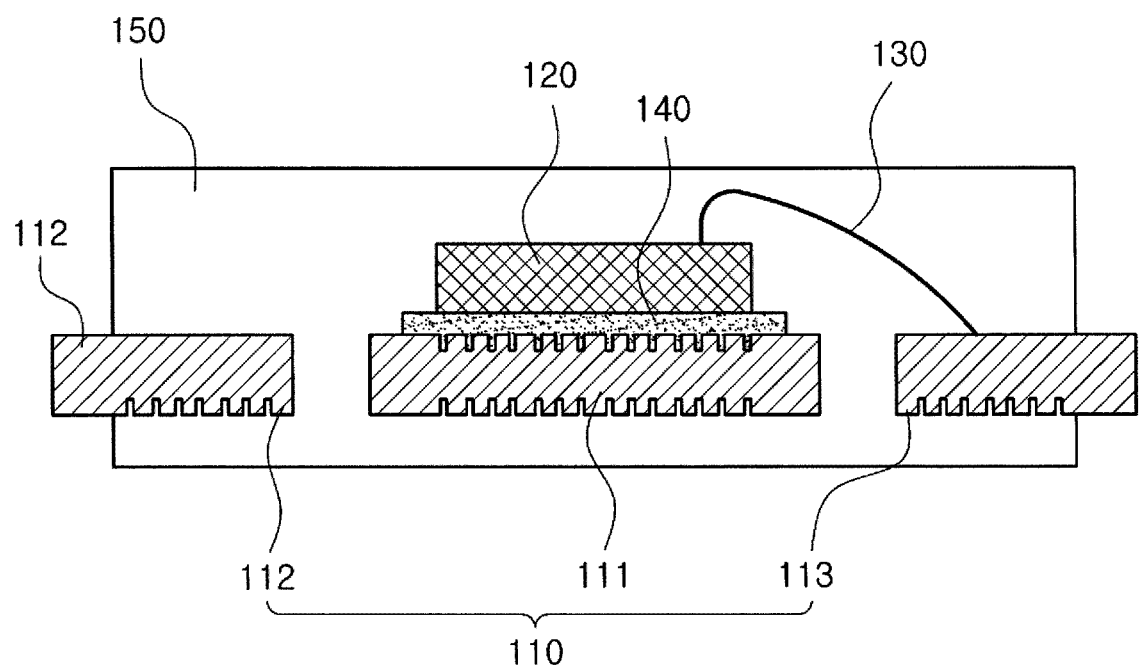
FIG. 8 is a cross-sectional view of a semiconductor package in which an engraved pattern is formed on a surface of a lead frame pad adhered to a lower surface of a semiconductor chip and lead frame leads according to another embodiment of the present invention.

FIG. 8 is a cross-sectional view of a semiconductor package in which the engraved pattern is formed on the upper surface of the lead frame pad 111 adhered to the semiconductor chip 120 according to another embodiment of the present invention. In this case, the adhesive 140 also penetrates the hollow parts in the engrave pattern formed on the lead frame pad 111 so that an adhesive force increases and the adhesive 140 may be prevented from being unnecessarily spread on the periphery thereof.

Figure 9:
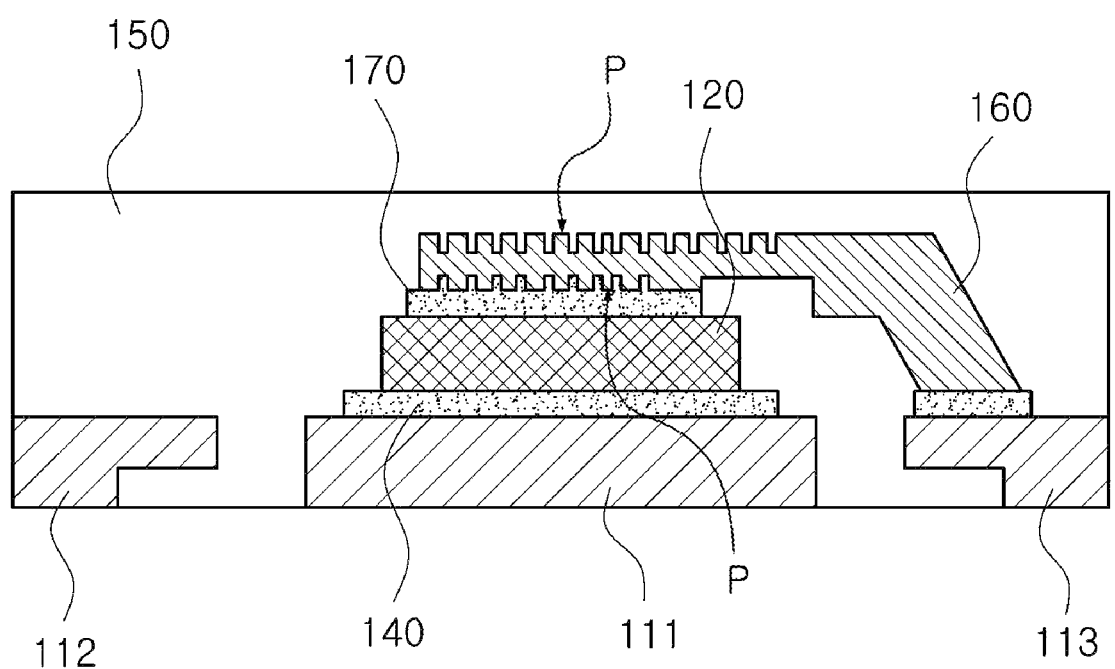
FIG. 9 is a cross-sectional view of a semiconductor package in which an engraved pattern is formed on a surface of a clip according to another embodiment of the present invention.

FIG. 9 is a cross-sectional view of a semiconductor package in which an engraved pattern is formed on a surface of a clip 160 adhered to the semiconductor chip 120 by an adhesive 170 and the surface of the clip 160 contacting the sealing material 150 according to another embodiment of the present invention. Here, the clip 160 is mainly formed of copper and the engraved pattern is formed on the clip 160 by laser irradiation. As illustrated in the drawing, the adhesive 170 adhering the semiconductor chip 120 to the clip 160 penetrates the hollow parts of the engraved pattern formed on the lower surface of the clip 160 so that an adhesive force increases and the adhesive 170 may be prevented from flowing on the periphery thereof. Also, the sealing material 150 penetrates the hollow parts of the engraved pattern formed on the upper surface of the clip 160 so that an adhesive force between the clip 160 and the sealing material 150 also increases.

Moreover, the engraved pattern may be formed on a contact surface of the clip 160 and the lead frame lead 113 and thus, an adhesive force between the clip 160 and the lead frame lead 113 may be improved.

Figure 10:
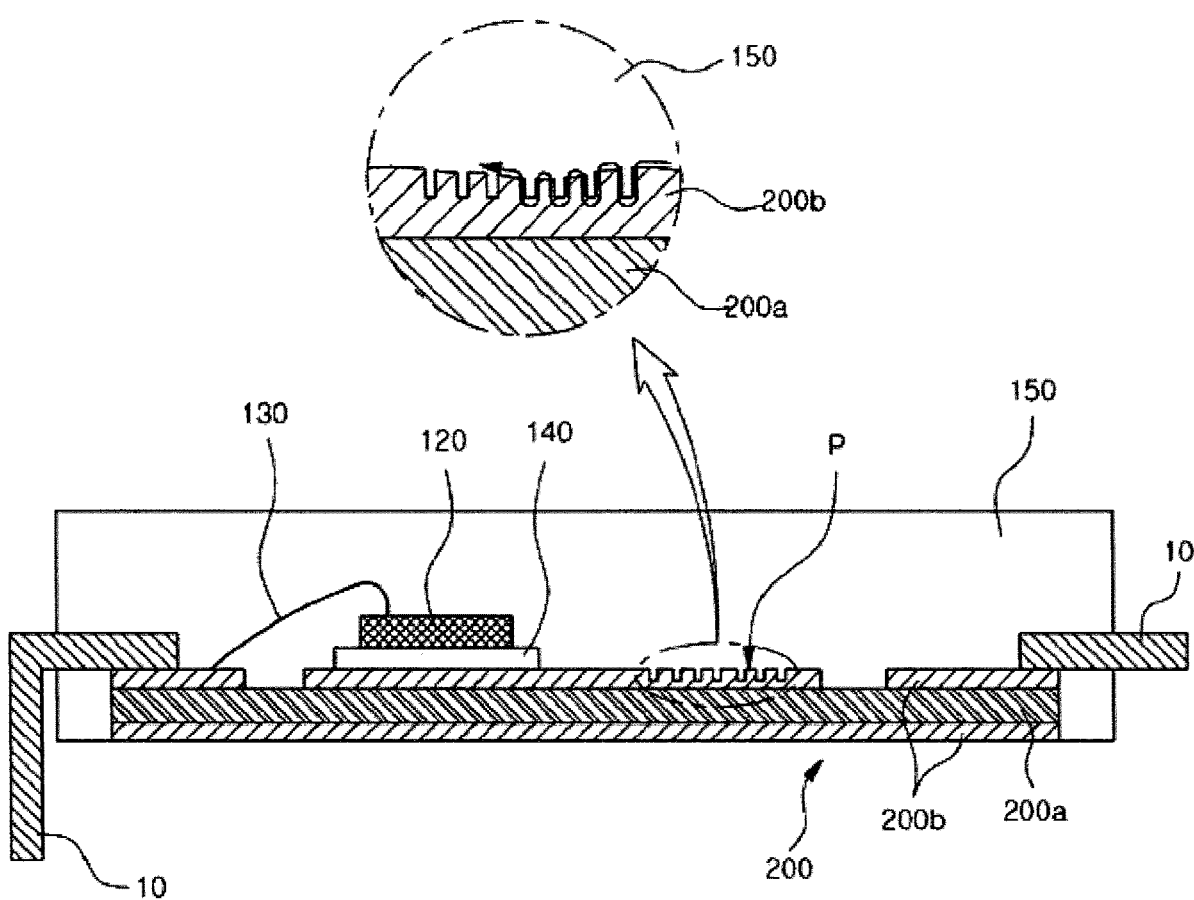
FIG. 10 is a cross-sectional view of a semiconductor package in which a finely engraved pattern is formed on a metal surface of an insulating substrate according to an embodiment of the present invention.

FIG. 10 is a cross-sectional view of a semiconductor package including a substrate 200 on which a finely engraved pattern is formed according to an embodiment of the present invention. As described above, the substrate 200 may be a metal substrate entirely formed of a metal or an insulating substrate formed by stacking a circuit pattern formed using a conductive material on upper and lower surfaces of a ceramic layer. Hereinafter, the insulating substrate is used to describe the invention as an example. As illustrated in FIG. 10, the substrate 200 includes an insulating layer 200a formed of ceramic at the center and metal layers 200b formed on upper and lower surfaces of the insulating layer 200a. Here, the semiconductor chip 120 is adhered on the upper surface of the metal layer 200b by using the conductive adhesive 140 such as solder and lead frames 10 are adhered on the other side of the upper surface of the metal layers 200b included in the substrate 200 by using solder or ultrasonic fusion. Here, a part of the metal layer 200b on which the semiconductor chip 120 is adhered and parts of the metal layers 200b on which the lead frames 10 are adhered are spaced apart from each other by a predetermined gap. Also, in order to supply the power to the semiconductor chip 120, the semiconductor chip 120 is electrically connected to the part of the metal layer 200b, on which the lead frame 10 is adhered, on the substrate 200 by the bonding wire 130. Here, a clip (not illustrated) may be used instead of the bonding wire 130. Hereinafter, it will be understood that the bonding wires all include a clip. The periphery of the substrate 200, the lead frames 10, the semiconductor chip 120, and the bonding wire 130 is molded by the sealing material 150 such as an EMC and thereby, a package body is formed. Here, the ends of the lead frames 10 are exposed to the outside of the sealing material 150 so as to be connected to a circuit part of an electronic device in which the semiconductor package 120 is mounted. Also, one surface of the substrate 200, for example, the lower surface of the substrate 200 (lower surface of the metal layer 200b) as illustrated in FIG. 10, may be exposed to the outside of the sealing material 150 for radiating heat.

Particularly in this embodiment, the finely engraved pattern as described above is formed on the metal surface of the substrate 200. The finely engraved pattern may be formed on any metal surface of the substrate 200 contacting the sealing material 150. For example, as illustrated in FIG. 10, the finely engraved pattern may be formed on one side of the upper surface of the metal layer 200b, on which the semiconductor chip 120 is formed. Although not illustrated, the finely engraved pattern may be formed on one side of the metal layer 200b, on which the lead frame 10 is adhered. Accordingly, the sealing material 150 penetrates and fills the inside of the hollow parts in the finely engraved pattern so that an adhesive force is improved compared to that of in a smooth surface-to-surface contact and separation of a metal surface may be prevented. Thus, electrical quality and reliability of a semiconductor package may be improved.

In a general semiconductor package, micro-moisture may easily penetrate the inside of the package along a gap between the substrate 200 and the sealing material 150, and thereby, corrosion of inner components in the semiconductor chip 120 may be frequently generated. Consequently, electrical properties may be lowered due to such internal corrosion and thereby, its reliability is decreased. However, as illustrated in a circle of FIG. 10, when the finely engraved pattern is formed on the metal layers 200b of the substrate 200, a direction of a path for micro-moisture penetration as indicated with an arrow is changed in a zig-zag form due to consecutive depths of the finely engraved pattern, a length of the path is relatively lengthened, and the hollows parts function as barriers. Accordingly, it is difficult for micro-moisture to penetrate the inside of the semiconductor package deeply and thus, possibilities for generating internal corrosion may be significantly lowered. Moreover, as described above, when the first metal projections are formed on the outer edges of the hollow parts in the finely engraved pattern, penetration of micro-moisture may be efficiently controlled. Furthermore, lowering of electrical properties occurring due to unnecessary spread of the adhesive on adhered parts may be prevented.

Figure 11:
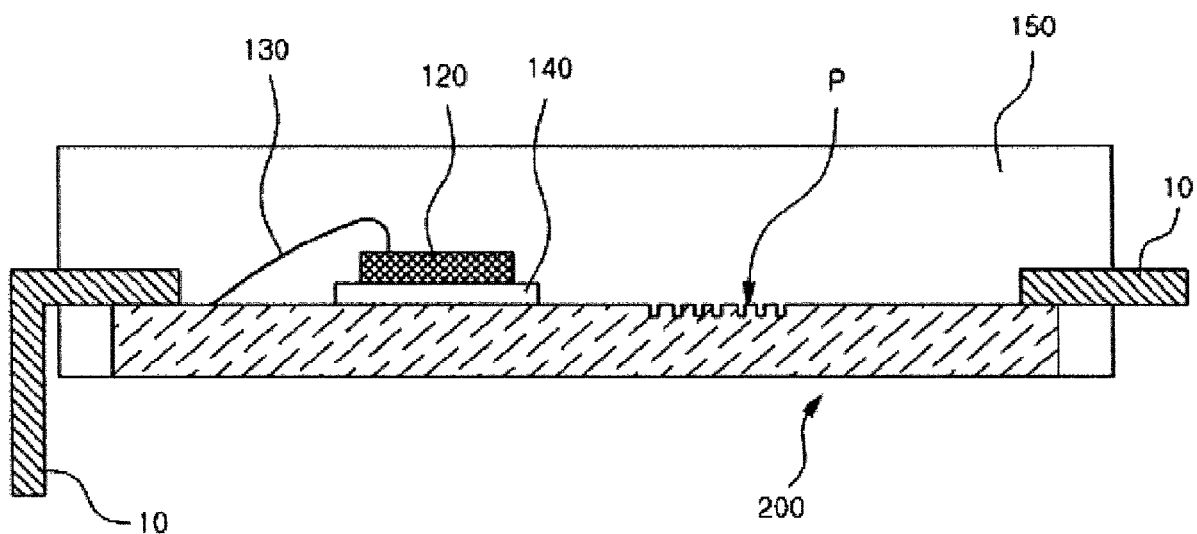
FIG. 11 is a cross-sectional view of a semiconductor package in which a finely engraved pattern is formed on a surface of a metal substrate according to an embodiment of the present invention.

FIG. 11 is a cross-sectional view of a semiconductor package where a metal substrate is used as the substrate 200. As illustrated in the drawing, the substrate 200 is entirely formed of a metal and the engraved pattern P is formed on the metal surface so that an adhesive force between the substrate 200 and the sealing material 150 increases.

Figure 12:
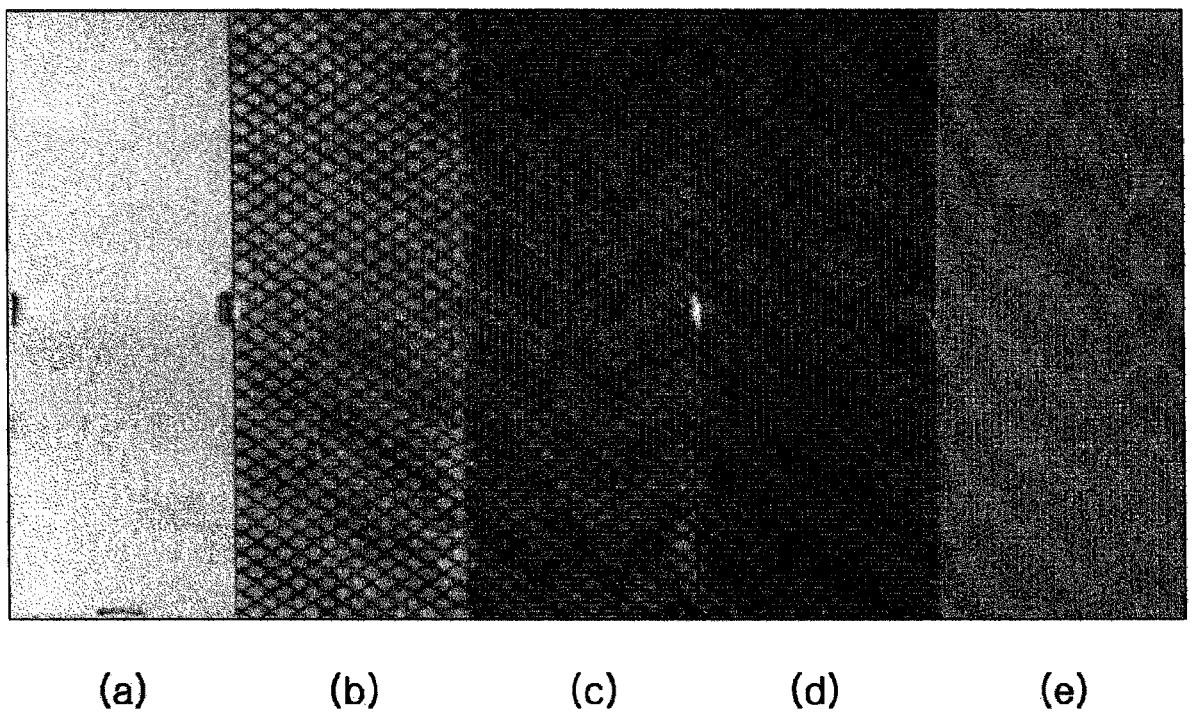
FIG. 12 illustrates pictures of metal samples for testing an adhesive force of a metal surface on which an engraved pattern is formed, according to an embodiment of the present invention.

In order to test an adhesive force of a metal surface including components of a semiconductor package on which the engraved pattern is formed according to the embodiment of the present invention, five samples are prepared as illustrated in FIG. 12. FIG. 12 illustrates Comparative Example 1 in (a) which is a general copper substrate without any processes performed thereon and Examples 1, 2, and 3 in (b), (c), and (d) which respectively are surfaces of copper substrates on which the diamond-shaped engraved pattern is formed by irradiating a laser. Also, FIG. 12 illustrates Comparative Example 2 in (e) which is a copper substrate having a rough surface formed by using a conventionally used method, etching, for increasing an adhesive force. Each sample is prepared as in the same size having a length of 32 mm, a width of 8 mm, and a thickness of 0.2 mm. In Examples 1 through 3, a frequency of a laser used in forming of the engraved pattern is 20 Khz and the engraved pattern is formed by moving a laser source in a speed of 100 mm/s.

The engraved pattern (b) of Example 1 is formed to have a depth of 18 μm by marking once with 60% of the maximum output power of the used laser light source. Also, the engraved pattern (c) of Example 2 is formed to have a depth of 66 μm by marking successively for two times with 100% of the maximum output power of the laser light source. In addition, the engraved pattern (d) of Example 3 is formed to have a depth of 81 μm by marking successively for three times with 70% of the maximum output power of the laser light source.

In order to measure an adhesive force of five samples prepared as described above, a sealing material is vertically adhered to each sample, a force is applied by pushing the side of the sealing material by using a push tool, and then, a force when the sealing material is separated from the sample is measured. Here, a tool used in measuring is Shear Tester Dage 4000 and KTMC-5400GV(KCC) is used as the sealing material.

Figure 13:
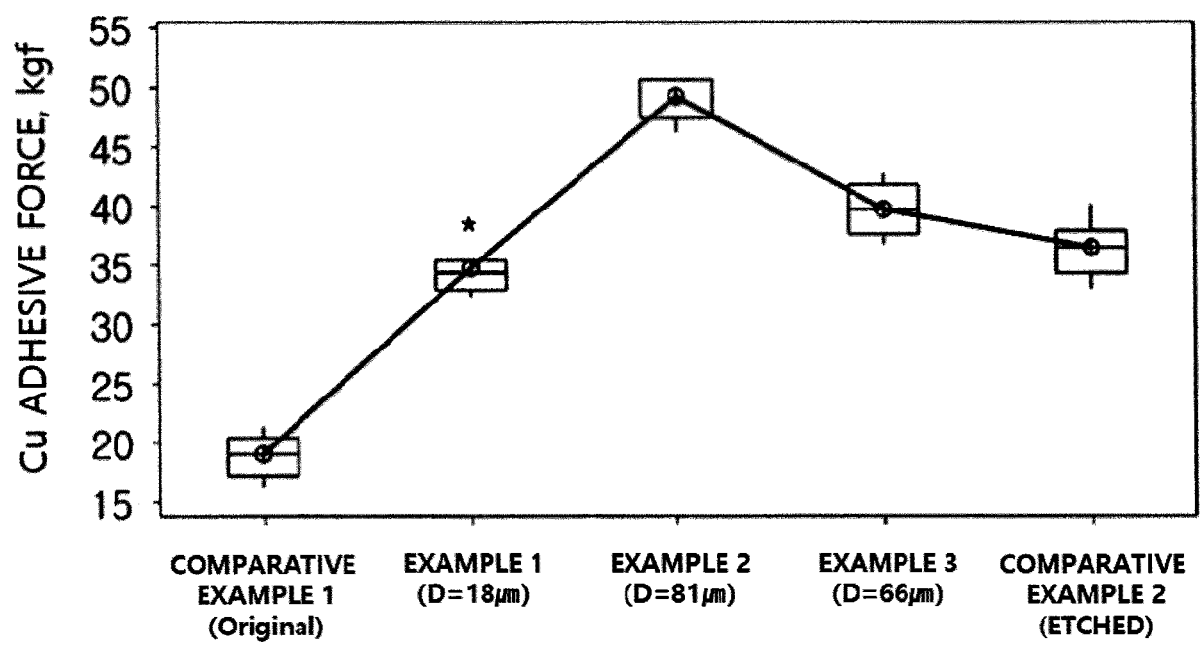
FIG. 13 is a graph showing a result of testing an adhesive force in Comparative Examples 1 and 2 and Examples 1 through 3.

FIG. 13 is a graph showing a result of testing an adhesive force in Comparative Examples 1 and 2 and Examples 1 through 3. As shown in FIG. 13, the adhesive forces of Examples 1 through 3, in which the engraved pattern is respectively formed, are significantly higher than that of Comparative Example 1, where any process is performed on the surface of the substrate. In Comparative Example 2, where the surface is rough after etching, the adhesive force is slightly higher than that of Example 1, however, is lower than those of Examples 2 and 3. As compared with the samples where the engraved pattern is respectively formed, the adhesive force of the sample in Example 2, which has the greatest depth of 81 µm, is the highest and the adhesive force of the sample in Example 1, which has the lowest depth of 18 µm, is the lowest. Since the adhesive force in Example 2, where the laser power is 70%, is higher than that of in Example 3, where the laser power is 100%, it will be understood that a degree of the adhesive force is determined according to a depth of the engraved pattern formed on the metal surface rather than the output of the irradiated laser.

Figure 14:
FIG. 14 respectively illustrates pictures of samples (a), (b), and (c) in Examples 1, 2, and 3 in which solder S is applied.
Figure 14:
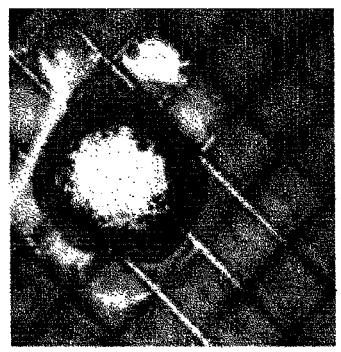
Figure 14:
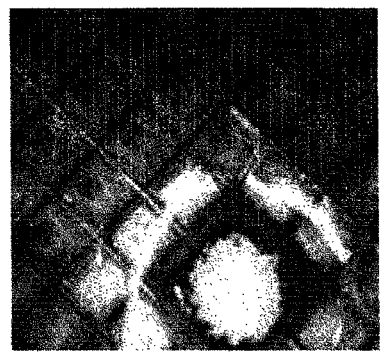

FIG. 14 respectively illustrates pictures of samples (a), (b), and (c) in Examples 1, 2, and 3 in which solder S is applied. As shown in FIG. 14, the solder applied in a dot-form flows through grooves formed by the engraved patterns by a capillary phenomenon and surface tension. Also, the solder does not spread to places where the engraved patterns are not formed. As described above, when the engraved pattern is formed on the surface of the metal plate, the adhesive such as the solder may be prevented from being widely spread to the periphery thereof and thus, reliability of a semiconductor package may be improved.

Figure 15:
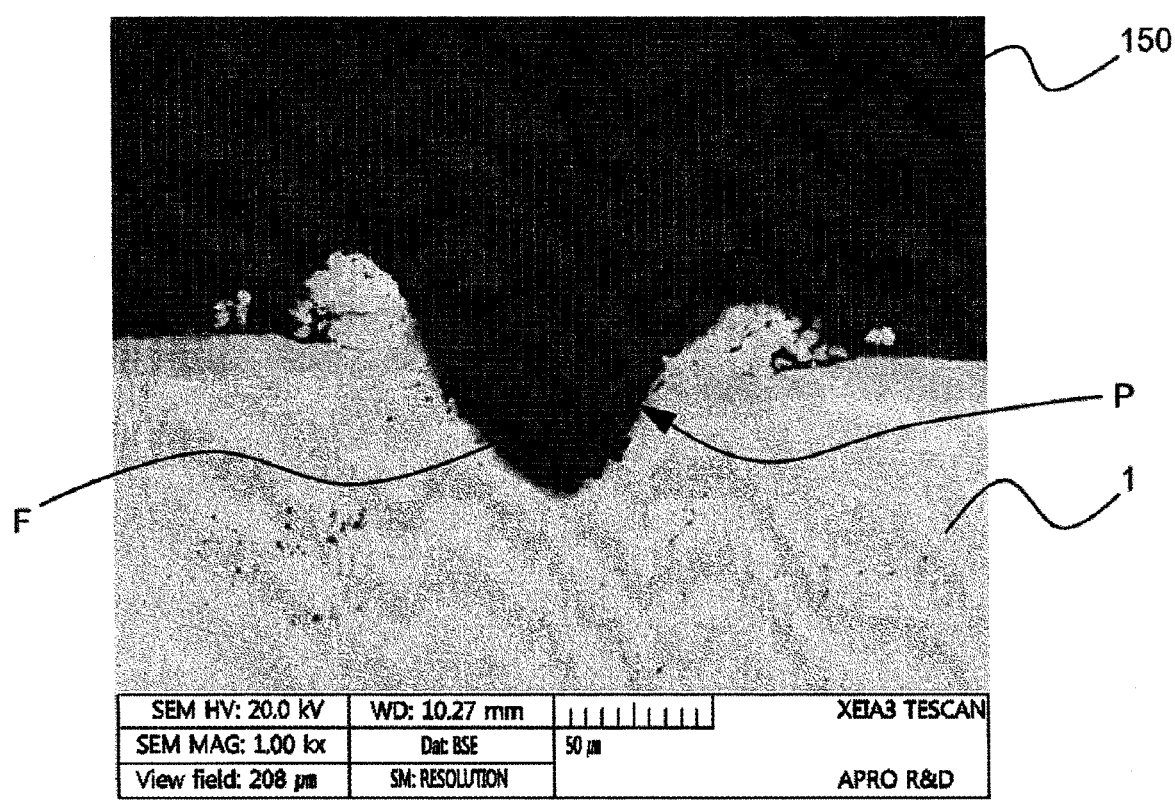
FIG. 15 is another picture capturing a cross-section of a metal surface, on which an engraved pattern is formed, by using a scanning electron microscope (SEM).

FIG. 15 is another picture capturing a cross-section of a surface of a metal 1, on which the engraved pattern P is formed, by using a scanning electron microscope (SEM). In general, the sealing material 150 used in a semiconductor package includes a filler F. The filler F is formed of a material having excellent heat transfer capability so as to smoothly release heat generated from a metal such as a substrate, a lead frame, or a clip. In the present invention, the sealing material 150 penetrates the inside of the engraved pattern P formed on the metal surface of components used in a semiconductor package such as the lead frame, the clip, and the substrate, as illustrated in FIG. 15. Accordingly, since the inside of the metal 1 including the lead frame, the clip, or the substrate and the filler F are nearly close to each other, heat generated from the metal 1 is transmitted to the filler F and thereby, may be smoothly released to the outside. Therefore, thermal stability of a semiconductor package may also be secured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A lead frame used in a semiconductor package comprising:
   an engraved pattern having a plurality of continuous line-form grooves formed on a metal surface of the lead frame;
   first metal projections projected relatively higher than the metal surface of the lead frame at outer edges of hollow parts in the engraved pattern; and
   second metal projections formed in an inner wall of the engraved pattern,
   wherein the engraved pattern has a depth of 2 µm to 100 µm.

2. The lead frame of claim 1, wherein the engraved pattern has a cross-section in a V form.

3. The lead frame of claim 1, wherein the engraved pattern has a cross-section in a U form.

4. The lead frame of claim 1, wherein the engraved pattern comprises any one selected from a diamond-shaped lattice pattern, a vertical line pattern, a triangle pattern, a diagonal line pattern, a square lattice pattern, a quadrangle pattern, a horizontal line pattern, a circle pattern, and a honeycomb pattern.

5. The lead frame of claim 1, wherein the engraved pattern has a width of 5 µm to 80 µm.

6. The lead frame of claim 1, wherein the first metal projections have a height of 0.5 µm to 50 µm.

7. A clip used in a semiconductor package comprising:
   an engraved pattern having a plurality of continuous line-form grooves formed on a metal surface of the clip;
   first metal projections projected relatively higher than the metal surface of the clip at outer edges of hollow parts in the engraved pattern; and
   second metal projections formed in an inner wall of the engraved pattern.

8. The clip of claim 7, wherein the engraved pattern has a cross-section in a V form.

9. The clip of claim 7, wherein the engraved pattern has a cross-section in a U form.

10. The clip of claim 7, wherein the engraved pattern comprises any one selected from a diamond-shaped lattice pattern, a vertical line pattern, a triangle pattern, a diagonal line pattern, a square lattice pattern, a quadrangle pattern, a horizontal line pattern, a circle pattern, and a honeycomb pattern.

11. The clip of claim 7, wherein the engraved pattern has a depth of 2 µm to 100 µm.

12. The clip of claim 7, wherein the engraved pattern has a width of 5 µm to 80 µm.

13. The clip of claim 7, wherein the first metal projections have a height of 0.5 µm to 50 µm.

14. A substrate used in a semiconductor package comprising:
   an engraved pattern having a plurality of continuous line-form grooves formed on a metal surface of the substrate;
   first metal projections projected relatively higher than the metal surface of the substrate at outer edges of hollow parts in the engraved pattern; and
   second metal projections formed in an inner wall of the engraved pattern,
   wherein the engraved pattern has a depth of 2 µm to 100 µm.

15. The substrate of claim 14, wherein the engraved pattern has a cross-section in a V form.

16. The substrate of claim 14, wherein the engraved pattern has a cross-section in a U form.

17. The substrate of claim 14, wherein the engraved pattern comprises any one selected from a diamond-shaped lattice pattern, a vertical line pattern, a triangle pattern, a diagonal line pattern, a square lattice pattern, a quadrangle pattern, a horizontal line pattern, a circle pattern, and a honeycomb pattern.

18. The substrate of claim 14, wherein the engraved pattern has a width of 5 µm to 80 µm.

19. The substrate of claim 14, wherein the first metal projections have a height of 0.5 µm to 50 µm.

20. A semiconductor package comprising:
   a lead frame;
   a semiconductor chip adhered on a pad of the lead frame;
   a clip electrically connecting the semiconductor chip to a lead of the lead frame;
   a sealing material molded to surround the periphery of the lead frame, the semiconductor chip, and the clip;
   an engraved pattern having a plurality of continuous line-form grooves formed on at least one or more metal surfaces of the lead frame and the clip;

first metal projections projected relatively higher than the metal surface at outer edges of hollow parts in the engraved pattern; and second metal projections formed in an inner wall of the engraved pattern.

21. The semiconductor package of claim 20, wherein the engraved pattern has a cross-section in a V form.

22. The semiconductor package of claim 20, wherein the engraved pattern has a cross-section in a U form.

23. The semiconductor package of claim 20, wherein the engraved pattern comprises any one selected from a diamond-shaped lattice pattern, a vertical line pattern, a triangle pattern, a diagonal line pattern, a square lattice pattern, a quadrangle pattern, a horizontal line pattern, a circle pattern, and a honeycomb pattern.

24. The semiconductor package of claim 20, wherein the engraved pattern has a depth of 2 μm to 100 μm.

25. The semiconductor package of claim 20, wherein the engraved pattern has a width of 5 μm to 80 μm.

26. The semiconductor package of claim 20, wherein the first metal projections have a height of 0.5 μm to 50 μm.

27. A semiconductor package comprising:
a substrate;
a semiconductor chip adhered on a metal surface of the substrate;
a lead frame adhered on the other metal surface of the substrate;
a bonding wire connecting the metal surface of the substrate, on which the lead frame is adhered, to the semiconductor chip;
a sealing material molded to surround the periphery of the substrate, the lead frame, the semiconductor chip, and the bonding wire;
an engraved pattern having a plurality of continuous line-form grooves formed on the metal surface of the substrate;
first metal projections projected relatively higher than the metal surface of the substrate at outer edges of hollow parts in the engraved pattern; and
second metal projections formed in an inner wall of the engraved pattern.

28. The semiconductor package of claim 27, wherein the engraved pattern has a cross-section in a V form.

29. The semiconductor package of claim 27, wherein the engraved pattern has a cross-section in a U form.

30. The semiconductor package of claim 27, wherein the engraved pattern comprises any one selected from a diamond-shaped lattice pattern, a vertical line pattern, a triangle pattern, a diagonal line pattern, a square lattice pattern, a quadrangle pattern, a horizontal line pattern, a circle pattern, and a honeycomb pattern.

31. The semiconductor package of claim 27, wherein the engraved pattern has a depth of 2 μm to 100 μm.

32. The semiconductor package of claim 27, wherein the engraved pattern has a width of 5 μm to 80 μm.

33. The semiconductor package of claim 27, wherein the first metal projections have a height of 0.5 μm to 50 μm.

34. A lead frame used in a semiconductor package comprising:
an engraved pattern having a plurality of continuous line-form grooves formed on a metal surface of the lead frame;
first metal projections projected relatively higher than the metal surface of the lead frame at outer edges of hollow parts in the engraved pattern; and
second metal projections formed in an inner wall of the engraved pattern,
wherein the first metal projections have a height of 0.5 μm to 50 μm.

35. A substrate used in a semiconductor package comprising:
an engraved pattern having a plurality of continuous line-form grooves formed on a metal surface of the substrate;
first metal projections projected relatively higher than the metal surface of the substrate at outer edges of hollow parts in the engraved pattern; and
second metal projections formed in an inner wall of the engraved pattern,
wherein the first metal projections have a height of 0.5 μm to 50 μm.

* * * * *